United States Patent
Suzuki et al.

(10) Patent No.: US 6,734,505 B2
(45) Date of Patent: May 11, 2004

(54) THIN FILM TRANSISTOR AND USE OF SAME

(75) Inventors: Hiroshi Suzuki, Yamato (JP); Takatoshi Tsujimura, Fujisawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/222,339

(22) Filed: Aug. 15, 2002

(65) Prior Publication Data
US 2003/0038288 A1 Feb. 27, 2003

(30) Foreign Application Priority Data
Aug. 16, 2001 (JP) ........................... 2001-246963

(51) Int. Cl.[7] ................. H01L 29/76; H01L 29/94; H01L 31/062; H01L 31/113; H01L 31/119
(52) U.S. Cl. ........................ 257/365; 257/366
(58) Field of Search ................. 257/365, 366

(56) References Cited

U.S. PATENT DOCUMENTS

| | | | | |
|---|---|---|---|---|
| 5,017,983 A | * | 5/1991 | Wu | 257/61 |
| 5,140,391 A | * | 8/1992 | Hayashi et al. | 257/365 |
| 5,808,595 A | * | 9/1998 | Kubota et al. | 345/92 |
| 6,342,717 B1 | * | 1/2002 | Komatsu | 257/347 |

FOREIGN PATENT DOCUMENTS

| | | |
|---|---|---|
| JP | 2616153 | 2/1992 |
| JP | 241997 | 9/1996 |
| JP | 2000-148087 | 5/2000 |
| JP | 2000-243963 | 9/2000 |
| JP | 2000-284750 | 10/2000 |
| JP | 2000-347624 | 12/2000 |

* cited by examiner

Primary Examiner—Ngân V. Ngô
(74) Attorney, Agent, or Firm—William N. Hogg

(57) ABSTRACT

Disclosed are a thin film transistor capable of controlling gray level of an organic LED element by discretely controlling current levels, a method of manufacturing the thin film transistor, an array substrate including the thin film transistor, a display device, and a method of driving the display device. The thin film transistor of the present invention includes an active layer formed on an insulating substrate, a plurality of insulating layers formed oppositely to each other with the active layer interposed therebetween, a first gate electrode and a second gate electrode formed adjacently to the insulating layers respectively, and wiring connected to the first and second gate electrodes respectively, the wiring controlling respective potentials of the first and second gate electrodes independently of each other. The area of the first gate electrode is different from the area of the second gate electrode, and current levels can be discretely controlled in at least four levels.

16 Claims, 10 Drawing Sheets

(a)

(b)

(c)

(d)

THIN FILM TRANSISTOR AND USE OF SAME

BACKGROUND OF THE INVENTION

The present invention relates to a thin film transistor including a so-called dual gate structure for driving the thin film transistor by using a plurality of gate electrodes and a method of manufacturing the thin film transistor. The present invention further relates to a display device including the thin film transistor, and a method of driving the display device.

An organic LED (light emitting diode) has a very high response speed and is a self-emitting device, and thus, it is expected that the application of the organic LED to a display device will allow providing an excellent flat display device having a wide viewing angle. The application of the organic LED to the flat display device replaces a liquid crystal display device. The above-mentioned organic LED is a current-driven element, and thus, the achievement of high-resolution display requires a continuous feed of a current through the organic LED element even during non-selection of a scanning line.

FIG. 9 is a diagram showing a circuit configuration for driving an organic LED, which has been heretofore proposed. The conventional circuit configuration shown in FIG. 9 includes a switching thin film transistor, hereinafter referred to as TFT 80, for generally performing switching, and a driver TFT 84 for driving an organic LED element 82. Switching TFT 80 is driven to be turned on and off in accordance with a signal supplied through a scan line 86, and thus supplies to driver TFT 84 a signal supplied through a signal line 88.

Switching TFT 80 is connected to a gate electrode of driver TFT 84 so as to control conductance of driver TFT 84. Under this control, driver TFT 84 supplies a current supplied from a supply line 90 to organic LED element 82 connected to a drain electrode of driver TFT 84 (to drive organic LED element 82). Thus, driver TFT 84 drives organic LED element 82. The conventional circuit shown in FIG. 9 for driving organic LED element 82 also has a configuration in which a charge storage capacitor 92 is connected to a line 94 so as to ensure a stable supply of a current required for organic LED element 82.

Driver TFT 84 supplies a current to organic LED element 82 in accordance with current levels determined by switching TFT 80. In the conventional circuit, the current levels are used under control by which the current levels are changed in about four levels. Time division is used simultaneously with the controlled current levels, thus enabling more levels of control. The use of a change in the current levels allows control on brightness of the organic LED, thereby enabling gray level control on light emission of the organic LED element and enabling high-resolution display.

Gray level control on organic LED element 82 is, in principle, made possible in the following manner: a voltage applied to a gate in performing gray level control on the organic LED element is controlled by using the circuit configuration shown in FIG. 9. The level of current flowing to organic LED element 82 is controlled by using the gate voltage. This relationship is shown in FIG. 10 as a graph which is obtained by plotting a current $I_{oled}$ flowing to a different organic LED element versus a gate voltage of switching TFT 80, in driving a typical organic LED element.

As shown in FIG. 10, the organic LED element varies in its current-voltage characteristics for each pixel because of various factors. Thus, the same gray level cannot be applied to the organic LED element stably even when a certain gate voltage $V_{gate}$ is applied to the organic LED element formed for one pixel each, as shown in FIG. 10. Consequently, a problem exists: when the current level is changed only by changing the gate voltage by use of the circuit configuration shown in FIG. 9 and then gray level control is performed by direct use of the changed current level, the use of only this gray level control does not permit display of precise gray level throughout the whole screen of the display device.

A method of performing gray level control by changing a luminous area of the organic LED element through only on-off control by utilizing the characteristics that a maximum current value $I_{max}$ and a minimum current value $I_{min}$ do not vary pixel by pixel even if the current-voltage characteristics vary as shown in FIG. 10, that is, a so-called area gray level control method, has been also proposed in order to solve the above-mentioned problem. FIG. 11 shows a drive circuit which has been heretofore proposed to implement the area gray level control method. In the drive circuit shown in FIG. 11, a plurality of organic LED elements 82 are arranged for each pixel 96, and the drive circuit is adapted to be capable of controlling the gray level by controlling the number of organic LED elements 82 to emit light in the luminous area.

FIG. 12 is a plan view showing a configuration in which a plurality of organic LED elements 82 are arranged for each pixel for performing the conventional area gray level control. Organic LED elements 82 are configured in such a manner that a signal is supplied to these organic LED elements from a wiring 98.

Although the method of controlling the gray level by means of the area gray level shown in FIGS. 11 and 12 allows precise gray level control, the method has the problem that the brightness of a display part is decreased because of a decrease in filling rate of organic LED elements 82 per pixel. A driving current may be increased in order to increase the brightness of the display part; however, another problem arises, such that the increase in the driving current causes a reduction in a luminous life of the organic LED element or in a life of the driver TFT. Furthermore, since the need arises to perform on-off control on each organic LED element, it also becomes necessary to increase the number of driving elements such as the driver TFT. Thus, the above-described also leads to a decrease in the filling rate of the organic LED elements per pixel.

For driving the organic LED, a thin film transistor (TFT), as described above, is often used to drive the organic LED for display per pixel. The TFT for use in this case, particularly, the driver TFT, is required to be capable of providing a high level of current with stability. Various TFT structures have been heretofore proposed as TFT structures having stabilized current characteristics. A so-called dual gate TFT structure is disclosed in the gazette of Japanese Patent Laid-Open No. Hei 8(1996)-241997, for example. In this structure, gate electrodes are located oppositely to each other so as to sandwich an active layer with insulating layers interposed between the gate electrodes, and one of the gate electrodes is formed shorter than the other gate electrode in a source-drain direction.

The disclosed dual gate TFT exhibits excellent pentode characteristics, and thus stabilizes a drain current even if a power supply voltage varies. However, the dual gate TFT structure disclosed in the gazette of Japanese Patent Laid-Open No. Hei 8(1996)-241997 uses the gate electrode formed shorter than the active layer to form high-resistance portions on both ends of a silicon active layer, thereby achieving excellent pentode characteristics. Therefore, dual gate TFT structure is not sufficient to provide a high current level required for driver TFT of the organic LED.

A TFT including a plurality of gate electrodes, that is, a so-called dual gate TFT, and a display device including dual gate TFT are also disclosed in the gazette of Japanese Patent Laid-Open No. 2000-243963. Dual gate TFT disclosed in the gazette of Japanese Patent Laid-Open No. 2000-243963 comprises a second gate electrode formed to be narrower than a channel length, and thus stabilizes a threshold voltage while preventing a leakage current. However, dual gate TFT disclosed in the gazette of Japanese Patent Laid-Open No. 2000-243963 does not enable gray level control through discrete control on current levels while keeping a high current level required for driver TFT of the organic LED element.

An electro luminescence display device is disclosed in the gazette of Japanese Patent Laid-Open No. 2000-347624. The electro luminescence display device includes a plurality of driving transistors for applying electrical charges stored in a capacitance to an electro luminescence device in accordance with an image signal, and mutual conductance of each driving transistor is set to be expressible as gray levels. Although the electro luminescence device disclosed in the gazette of Japanese Patent Laid-Open No. 2000-347624 can be expressed as gray levels, a plurality of driving transistors must be formed in each pixel, thereby causing a reduction in the filling rate of the organic LED elements. As a result, a problem arises in that the brightness per pixel decreases.

Furthermore, in the gazette of Japanese Patent Laid-Open No. 2000-148087, a TFT structure and a display device are disclosed, the TFT structure including a semiconductor layer, gate insulating films formed on opposite surfaces of the semiconductor layer, and first and second gate electrodes formed on the gate insulating films, respectively. Although the TFT structure disclosed makes it possible to improve yields in manufacturing by increasing a numerical aperture of each pixel, the TFT structure is not adequate to enable gray level control through discrete control on current levels while ensuring a high current level required for the organic LED, and to provide a display device having high brightness and a long life.

The present invention is directed at overcoming the problems as set forth above.

SUMMARY OF THE INVENTION

Accordingly, it is an object of the present invention to provide a thin film transistor which enables gray level display of an organic LED element by performing discrete control on current levels supplied to an organic LED by performing only on-off control of a gate potential, without causing a reduction in brightness due to a reduction in a luminous area and also without causing a decrease in a filling rate of the organic LED elements.

It is another object of the present invention to provide a method of manufacturing a thin film transistor having the above-mentioned characteristics.

It is a still yet another object of the present invention to provide a display device which is capable of providing excellent gray level characteristics by performing discrete control on current levels by the use of the above-mentioned thin film transistor substrate.

It is further another object of the present invention to provide a method of driving the display device using the above-mentioned thin film transistor substrate, which enables the display device to be subjected to gray level control and to active matrix drive.

According to one aspect of the invention, there is provided a thin film transistor comprising a first insulating film having a first and a second surface, an active layer positioned on a portion of the first surface of the first insulating film, a second insulating film positioned on the active layer and on the first surface of the first insulating film, a first gate electrode having a first area positioned on the second surface of the first insulating film, a second gate electrode positioned on the second insulating film, the second gate electrode having a second area less than or greater than the first area of the first gate electrode, a first conductor connected to the first gate electrode for applying a first voltage to the first gate electrode, and a second conductor connected to the second gate electrode for applying a second voltage to the second gate electrode.

According to another aspect of the invention, there is provided a method of manufacturing a thin film transistor comprising the steps of providing a first insulating film having a first and a second surface, positioning an active layer on a portion of the first surface of the first insulating film, positioning a second insulating film on the active layer and on the first surface of the first insulating film, positioning a first gate electrode having a first area on the second surface of the first insulating film, positioning a second gate electrode on the second insulating film, the second gate electrode having a second area less than or greater than the first area of the first gate electrode, connecting a first conductor to the first gate electrode for applying a first voltage to the first gate electrode, and connecting a second conductor to the second gate electrode for applying a second voltage to the second gate electrode.

According to yet another aspect of the invention, there is provided a display device, comprising an organic LED element including a plurality of pixels, a switching thin film transistor electrically connected to at least one of the plurality of pixels, and a driver thin film transistor electrically connected to the at least one of the plurality of pixels.

According to still yet another aspect of the invention, there is provided a method of driving a display device comprising the steps of providing an organic LED element including a plurality of pixels, providing a driver thin film transistor including a first gate electrode and a second gate electrode positioned therein, a first conductor connected to the first gate electrode for applying a first voltage to the first gate electrode, a second conductor connected to the second gate electrode for applying a second voltage to the second gate electrode, electrically connecting the driver thin film transistor to one of the plurality of pixels, controlling the first voltage and the second voltage to the first and second conductors, respectively, and supplying a level of driving current from the driver thin film transistor to the organic LED element.

The above objects, advantages, and features of the present invention will become more readily apparent from the following detailed description of the presently preferred embodiments as illustrated in the accompanying drawings.

DETAILED DESCRIPTION OF THE PREFERRED EMBODIMENTS

Figure 1:
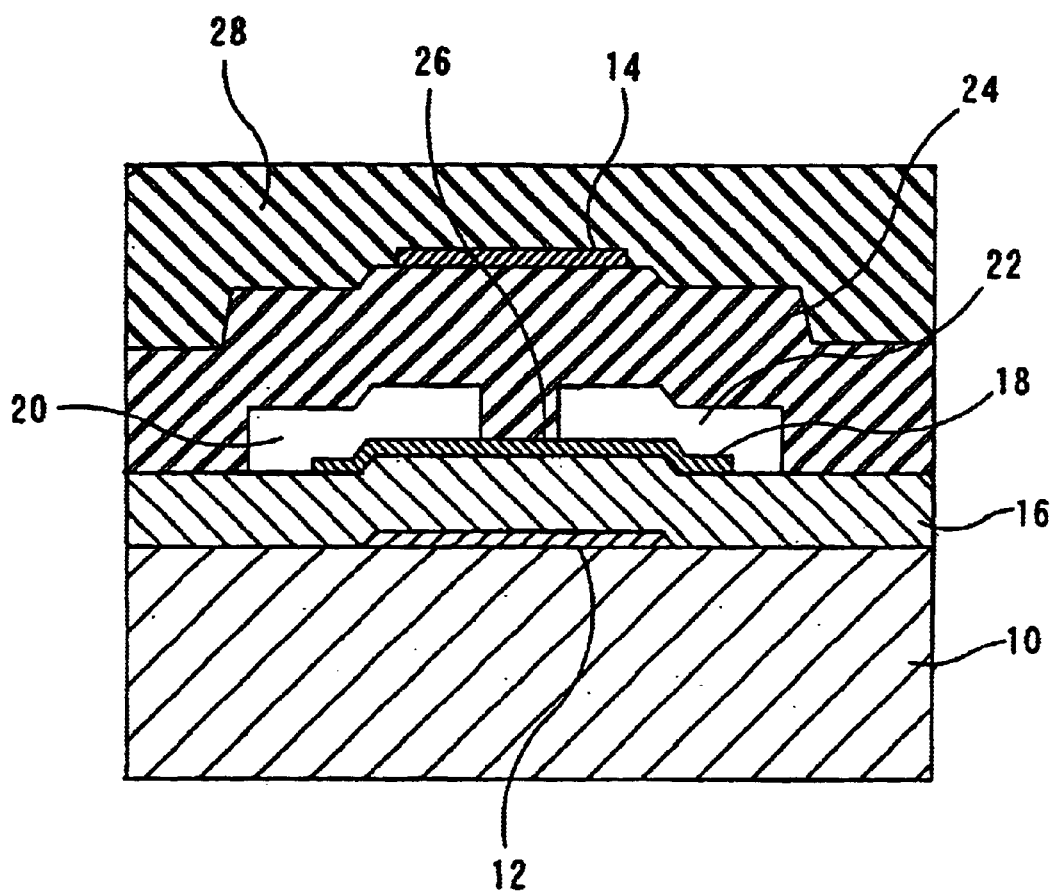
FIG. 1 is a cross-sectional view in elevation showing a schematic configuration of the dual gate TFT of the present invention.

The present invention will be described in detail below with reference to an embodiment shown in the drawings. FIG. 1 is a cross-sectional view showing a schematic configuration of a dual gate TFT of the present invention. Dual gate TFT of the present invention includes a first gate electrode 12 formed on an insulating substrate 10 made of glass or the like, and a second gate electrode 14. Between first gate electrode 12 and second gate electrode 14, formed are: a first gate insulating film 16; an active layer 18; a source electrode 20 and a drain electrode 22 which are formed adjacently to the active layer and function to define a channel; and a second gate insulating film 24 for insulating the second gate electrode from a lower thin film transistor element.

In the present invention, a channel length refers to the length of the active layer from the source electrode to the drain electrode, which is defined between the source electrode and the drain electrode. In the present invention, the ends of the channel refer to respective ends of the source and drain electrodes and the active layer.

First gate insulating film 16 and second gate insulating film 24 may be made of the same material or different materials, and the materials therefor can be selected from materials such as $SiO_x$, $Si_yN_z$ and $Si_xO_yN_z$ (herein, x, y and z represent any positive real number). The above-mentioned active layer 18 can be made of any known material, for example, a semiconductor such as amorphous silicon, polycrystalline silicon or single-crystal silicon.

In the present invention, the electrodes such as the above-mentioned gate electrodes, source electrode and drain electrode can be also made of any known electrode material. The materials for the above electrodes can be appropriately selected from, for example, aluminum (Al), tungsten (W), molybdenum (Mo), molybdenum-tungsten (Mo-W), chromium (Cr) and the like, or any combination of these materials can be used therefor.

As shown in FIG. 1, dual gate TFT of the present invention is configured in such a manner that first gate electrode 12 and second gate electrode 14 extend longer than the channel length of channel 26 defined between source electrode 20 and the drain electrode 22. Thus, the dual gate TFT of the present invention is configured as capable of ensuring a uniform electric field throughout channel 26 and of extending its life without a nonuniform increase in a current density in the channel even when the dual gate TFT of the present invention is used as a driver TFT for an organic LED element.

Furthermore, first gate electrode 12 and second gate electrode 14 of the dual gate TFT shown in FIG. 1 are formed so as to have different areas. These gate electrodes are configured in such a manner that the independently-controllable transistor structures, which are formed by first and second gate electrodes 12 and 14 of the dual gate TFT as shown in FIG. 1, have different conductance. Thus, the dual gate TFT of the present invention performs on-off control of the gate electrodes of the respective transistor structures, thereby enabling discrete control on a plurality of current levels, and further enabling gray level control on light emission of the organic LED element.

In the dual gate TFT shown in FIG. 1, a passivation layer 28 formed of an insulating film is formed over second gate electrode 14. Passivation layer 28 is configured to ensure reliability of operations of the structures of the layers under the passivation layer. The passivation layer 28 can be made of any known insulating material such as $SiO_x$, $SiN_y$ or $SiO_xN_y$.

Figure 2:
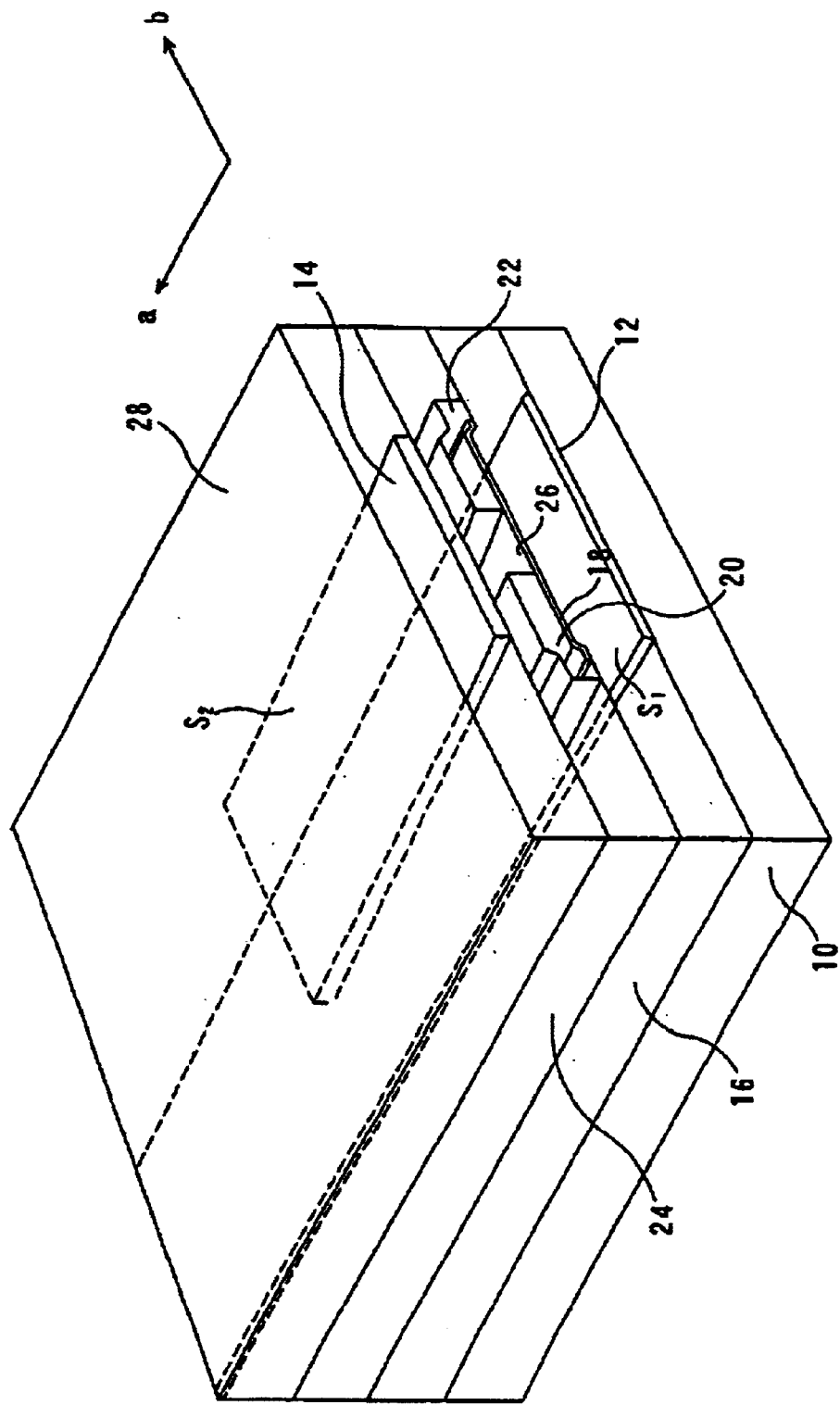
FIG. 2 is a perspective view showing in detail the arrangement of a first gate electrode and a second gate electrode of the dual gate TFT of the present invention relative to a channel.

FIG. 2 is a perspective view showing in detail the arrangement of first and second gate electrodes 12 and 14 of dual gate TFT of the present invention relative to channel 26. As shown in FIG. 2, first and second gate electrodes 12 and 14 are formed in such a manner that an area $S_1$ of first gate electrode 12 is different from an area $S_2$ of second gate electrode 14. As described above, first and second gate electrodes 12 and 14 are formed in such a manner that the areas $S_1$ and $S_2$ are different from each other. Therefore, when first and second gate electrodes 12 and 14 are turned on, the conductance of first gate electrode 12 differs from the conductance of second gate electrode 14, thus enabling at least four levels of gray level control.

In the embodiment of the present invention shown in FIG. 2, second gate electrode 14 is formed shorter than first gate electrode 12 in the directions shown by the arrows a and b in FIG. 2. Thus, second gate electrode 14 has the area $S_2$ smaller than the area $S_1$ of first gate electrode 12. In the present invention, however, second gate electrode 14 formed in the upper part of the TFT is not necessarily required to have a smaller area. Thus, first gate electrode 12 may have a smaller area than second gate electrode 14, or any dimension and any known patterning process can be used to form the first and second gate electrodes to have different areas.

Figure 3:
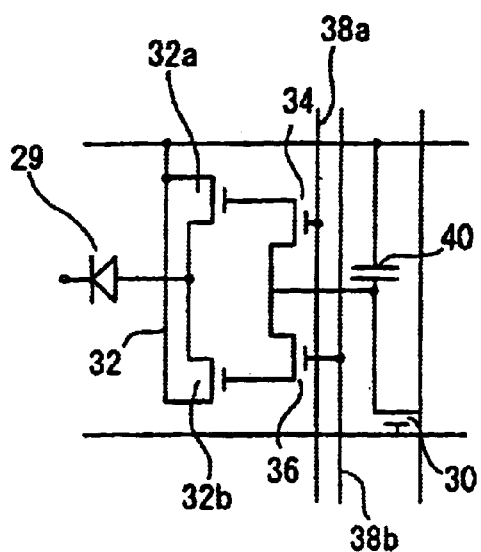
FIG. 3 is a diagram showing a schematic circuit configuration of a transistor element and an organic LED element, which are formed in one pixel of a thin film transistor array substrate using the dual gate TFT of the present invention.

FIG. 3 is a diagram showing a schematic circuit configuration of a transistor element and an organic LED element, which are formed in one pixel of a thin film transistor array substrate using dual gate TFT of the present invention. As shown in FIG. 3, switching TFT 30 for switching on and off organic LED element 29, and driver TFT 32 for feeding a current to organic the LED element are formed in the pixel of the thin film transistor array substrate of the present invention.

Driver TFT 32 is formed to have the above-described dual gate configuration, and is configured to function as top gate TFT and bottom gate TFT which are independent of each other. Switching TFT 30 is connected to a plurality of controllers 34 and 36, and are configured to independently control top gate part 32a and bottom gate part 32b of driver TFT 32 in accordance with select signals supplied through select lines 38a and 38b, respectively.

Top gate part 32a of the present invention corresponds to a transistor part composed of second gate electrode 14, source electrode 20 and drain electrode 22 shown in FIG. 1, and bottom gate part 32b thereof corresponds to a transistor part composed of first gate electrode 12, source electrode 20 and drain electrode 22. The above-mentioned controllers 34 and 36 of the present invention may be specifically formed of either a bottom gate type or top gate type thin film transistor. In the embodiment shown in FIG. 3, a capacitor 40 is formed in the pixel, capacitor 40 being located between switching TFT 30 and controllers 34 and 36. Thus, a required current can be supplied to driver TFT 32 with stability through controllers 34 and 36.

Figure 4:
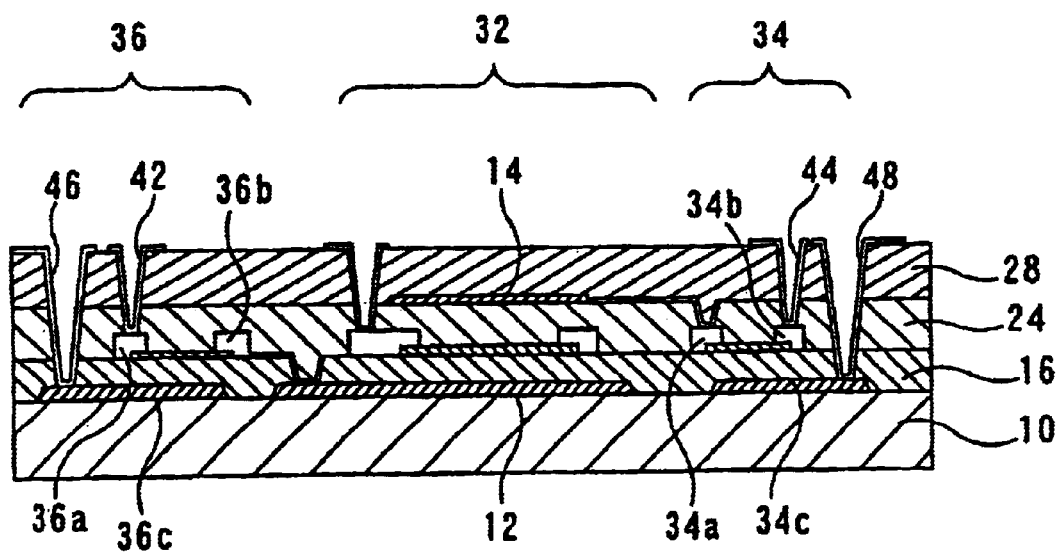
FIG. 4 is a cross-sectional view in elevation showing a part of the thin film transistor array substrate according to an embodiment of the present invention on which a driver TFT and controllers shown in FIG. 3 are formed.

FIG. 4 is a cross-sectional view showing a part of the thin film transistor array substrate according to the embodiment of the present invention on which driver TFT 32 and controllers 34 and 36 shown in FIG. 3 are formed. To clearly show the configuration, the embodiment shown in FIG. 4 has the configuration in which controllers 34 and 36 are located on both sides of driver TFT 32.

As shown in FIG. 4, driver TFT 32 is configured so that top gate part 32a and bottom gate part 32b, both defined above, can function independently of each other, second gate electrode 14 is connected to source electrode 34a of controller 34, and first gate electrode 12 is connected to drain electrode 36b of controller 36. Drain electrode 34b of controller 34 and source electrode 36a of controller 36 are connected to a drain electrode of the switching TFT (not shown) through connecting means such as contact holes 42 and 44. Thus, controllers 34 and 36 can control conductance in accordance with a signal supplied to a signal line. In the present invention, the source electrode and the drain electrode to be connected can be appropriately set according to the type of a charge carrier of the active layer.

Gate electrodes 34c and 36c of controllers 34 and 36 are connected to select lines 38a and 38b (not shown) through contact holes 46 and 48, respectively, and thus, the gate potentials of the gate electrodes can be controlled independently of each other in accordance with the select signals supplied to the select lines. In the thin film transistor array substrate of the present invention, the adoption of the above-described configuration allows performing discrete control on the brightness of organic LED element 29 by controlling the current levels supplied to the organic LED element through the on-off control of the gate potential.

Therefore, gray level control on organic LED element 29 according to the present invention can be performed with stability without depending on characteristics of individual organic LED elements. According to the present invention, it is not necessary to arrange a plurality of organic LED elements 29 in one pixel, thereby preventing a considerable decrease in the filling rate of the organic LED elements. For the above reason, the life of the thin film transistor array substrate including the organic LED elements is not adversely affected by the supply of a high level of current to one organic LED element 29 for the purpose of increasing the brightness.

Figure 5:
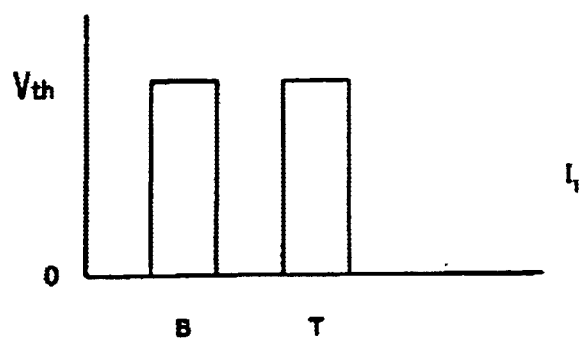
FIG. 5 is a set of four graphs showing a method of driving the elements of the thin film transistor array substrate of the present invention, by use of a correlation between control of the controllers and on-off control of a top gate part and a bottom gate part of the driver TFT corresponding to the control of the controllers.
Figure 5:
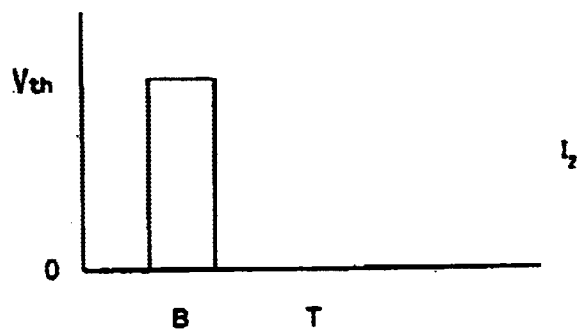
Figure 5:
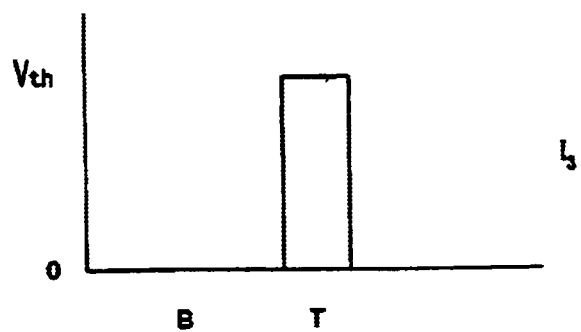
Figure 5:
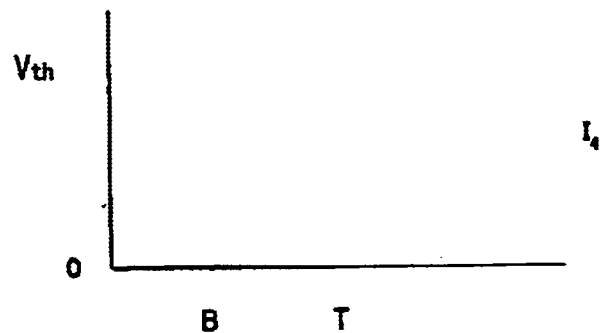

FIG. 5 is a set of four graphs illustrating a method of driving the respective elements of the thin film transistor array substrate of the present invention, by use of a correlation between the control of controllers 34 and 36 and the on-off control of top gate part 32a (T) and bottom gate part 32b (B) of driver TFT 32 corresponding to the control of controllers 34 and 36. In FIG. 5, Vth indicates a threshold voltage applied to the respective gate electrodes of controllers 34 and 36 in order to turn on and off top gate part 32a and bottom gate part 32b. Controller 34 can independently perform on-off control of top gate part 32a, and controller 36 can independently perform on-off control of bottom gate part 32b. Thus, current levels $I_1$ to $I_4$, where I is defined as current to an LED, can be discretely controlled corresponding to the on-off control of controller 34 and the on-off control of controller 36. Table 1 shows the correspondence between the current levels $I_1$ to $I_4$, as shown in FIG. 5, and the on/off switching states of controllers 34 and 36 which are turned on and off by the driving method of the present invention (varying the threshold voltage Vth to the gate electrodes 36c and 34c of controllers 34 and 36, respectively.

TABLE 1

|  |  | controller 34 | |
|---|---|---|---|
|  |  | ON | OFF |
| controller 36 | ON | $I_1$ | $I_2$ |
|  | OFF | $I_3$ | $I_4$ |

Figure 6:
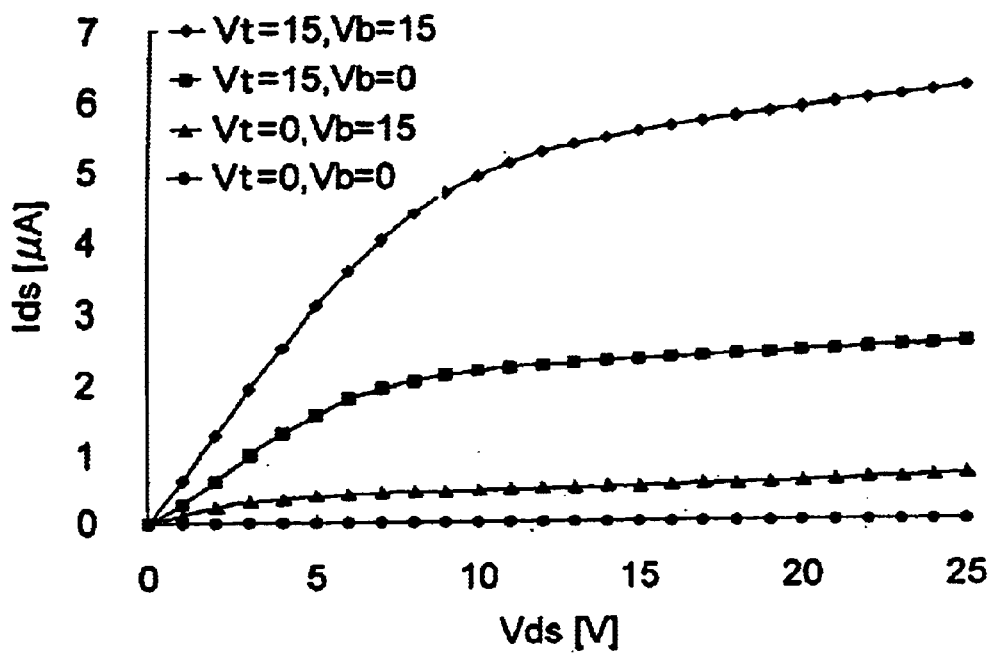
FIG. 6 is a graph showing current characteristics supplied to the organic LED element according to control levels by the driving method of the present invention.

FIG. 6 is a graph showing current characteristics supplied to organic LED element 29 (FIG. 3) according to respective control levels by the driving method of the present invention. In FIG. 6, Vt represents the potential of the second gate electrode (constituting top gate part 32a), and Vb represents the potential of the first gate electrode (constituting bottom gate part 32b). The current characteristics shown in FIG. 6 refer to a current supplied to organic LED element 29, which is obtained by plotting a drain-source current $I_{ds}$ of driver TFT 32 versus a drain-source voltage $V_{ds}$ of the driver TFT. As shown in FIG. 6, controllers 34 and 36 undergo the on-off control in accordance with select signals applied to controllers 34 and 36, and thus, controllers 34 and 36 control top gate part 32a and bottom gate part 32b independently of each other. Accordingly, the drain-source current $I_{ds}$ can be controlled in four gray levels. In the present invention, the discrete current levels shown in FIG. 6 can be appropriately set to required levels by changing the area $S_2$ of second gate electrode 14 of top gate part 32a and area $S_1$ of first gate electrode 12 of bottom gate part 32b.

Figure 7:
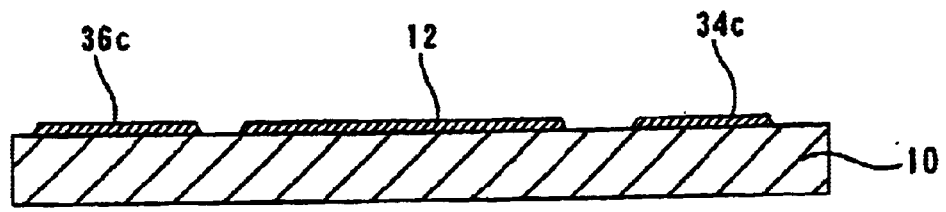
FIGS. 7(a) to 7(d) are cross-sectional views in elevation illustrating a method of manufacturing a thin film transistor including the driver TFT and the controllers of the present invention.
Figure 7:
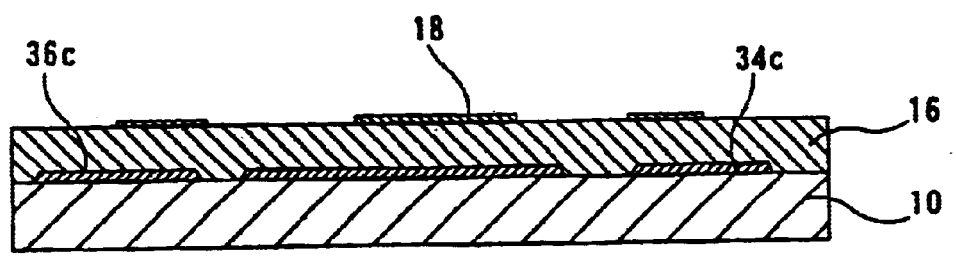
Figure 7:
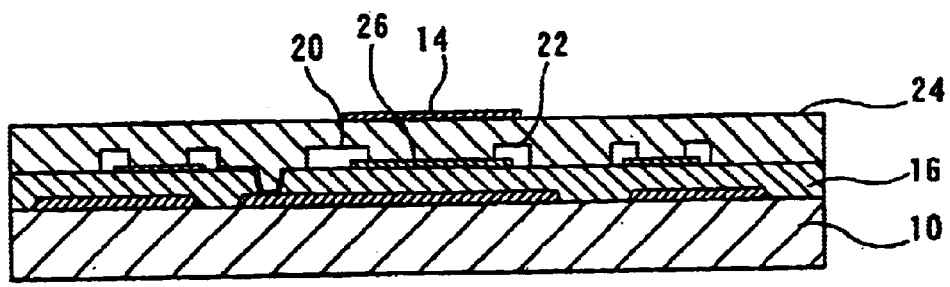
Figure 7:
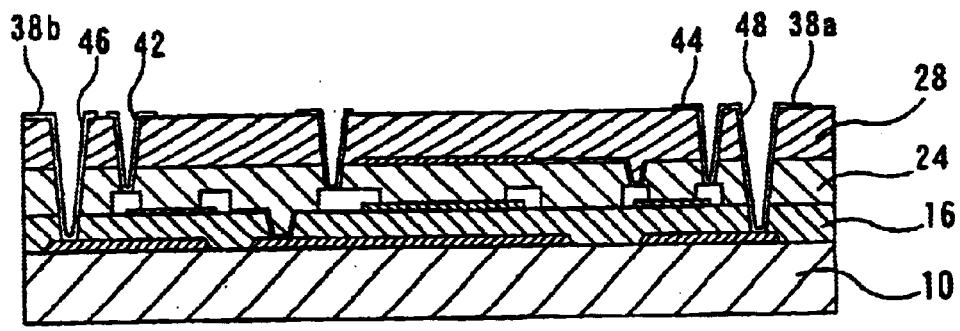

FIGS. 7(a) to 7(d) are cross-sectional views in elevation illustrating a method of manufacturing a thin film transistor including driver TFT and the controllers of the present invention. A description will be given with regard to the embodiment shown in FIGS. 7(a) to 7(d), in which each of the controllers 34 and 36 is formed of a bottom gate TFT and the configuration shown in FIG. 4 is adopted. In a method of manufacturing driver TFT of the present invention, as shown in FIG. 7(a), first gate electrode 12 and gate electrodes 34c and 36c for the controllers are formed on insulating substrate 10 by means of sputtering, vacuum deposition and appropriate photolithography.

As shown in FIG. 7(b), first gate insulating film 16 is deposited on the resultant structure, and active layer 18 is deposited on the first gate insulating film by means of a method such as chemical vapor deposition using a material such as amorphous silicon, polycrystalline silicon or single-crystal silicon, and then the active layer is formed by means of appropriate photolithography.

In FIG. 7(c), source electrode 20 and drain electrode 22 are formed, and second gate insulating film 24 is deposited thereon, and then second gate electrode 14 is formed on the second gate insulating film. In the described embodiment of the present invention, in point of supplying high current levels with stability, it is preferable that second gate electrode 14 have a smaller area than first gate electrode 12 and that the second gate electrode extends longer than the length between the both ends of channel 26 defined as the length of active layer 18 between source electrode 20 and drain electrode 22.

Furthermore, as shown in FIG. 7(d), passivation layer 28 is deposited by means of, for example, chemical vapor deposition so as to coat the elements under the passivation layer. Thereafter, gate electrodes 34c and 36c of controllers 34 and 36 are connected to select signal lines 38a and 38b through contact holes 46 and 48, and then drain electrode 34b and source electrode 36a are connected to switching TFT 30 through contact holes 44 and 42.

Select signal lines 38a and 38b, and any other necessary wiring and the like can be formed by means of an appropriate method such as sputtering, vacuum deposition and a photolithography process. Any known deposition method and photolithography may be used in the above-mentioned process, or the photolithography process may take place through any procedure so long as the structure shown in FIG. 7(d) can be obtained.

Figure 8:
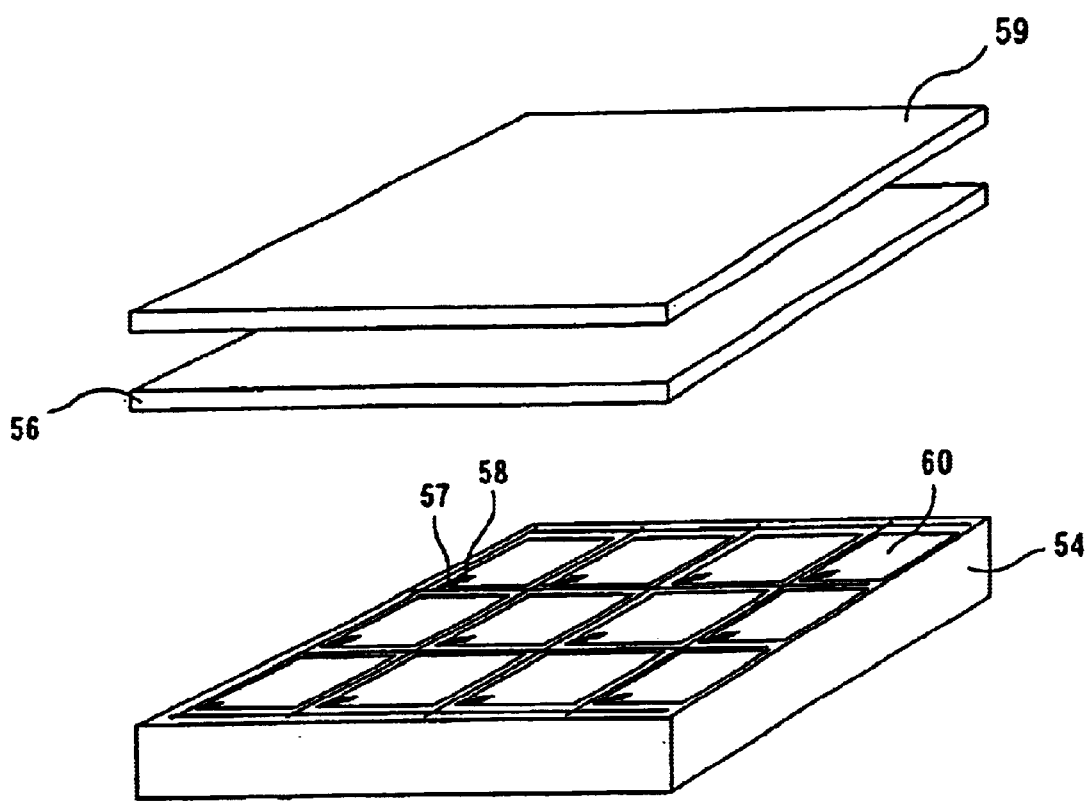
FIG. 8 is an illustration showing an organic LED display device including the thin film transistor array substrate of the present invention.
Figure 9:
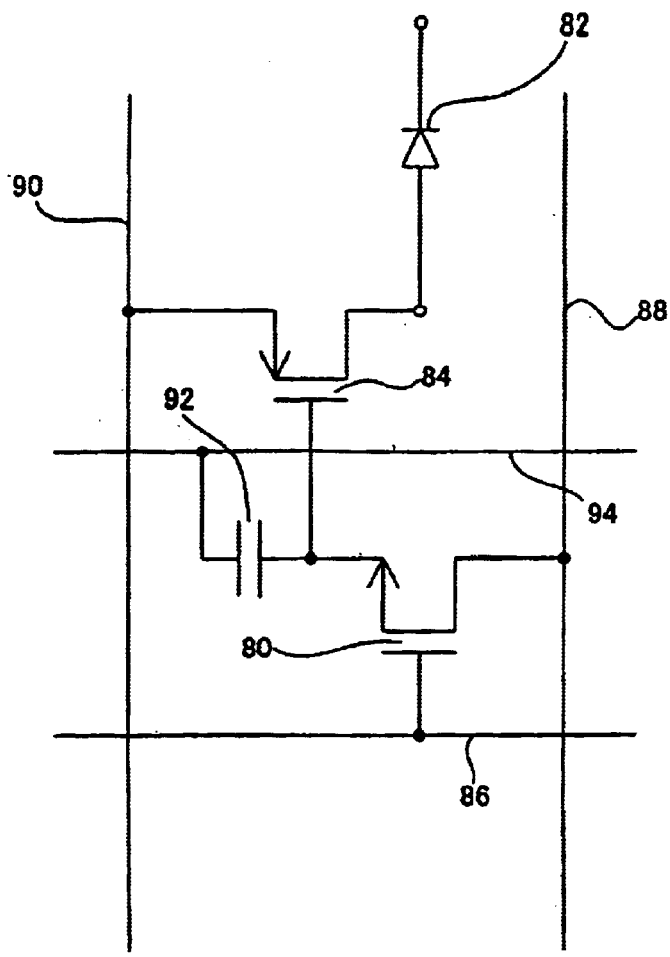
FIG. 9 is a diagram showing a circuit configuration for driving an organic LED, which has been heretofore proposed.
Figure 10:
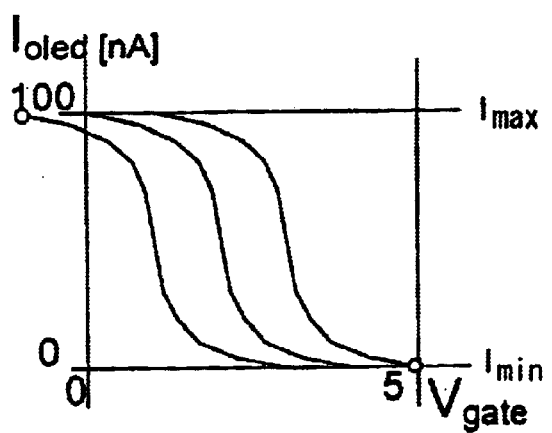
FIG. 10 is a graph which is obtained by plotting a current $I_{oled}$ flowing to a different organic LED element versus a gate voltage of a switching TFT, in driving a typical organic LED element.
Figure 11:
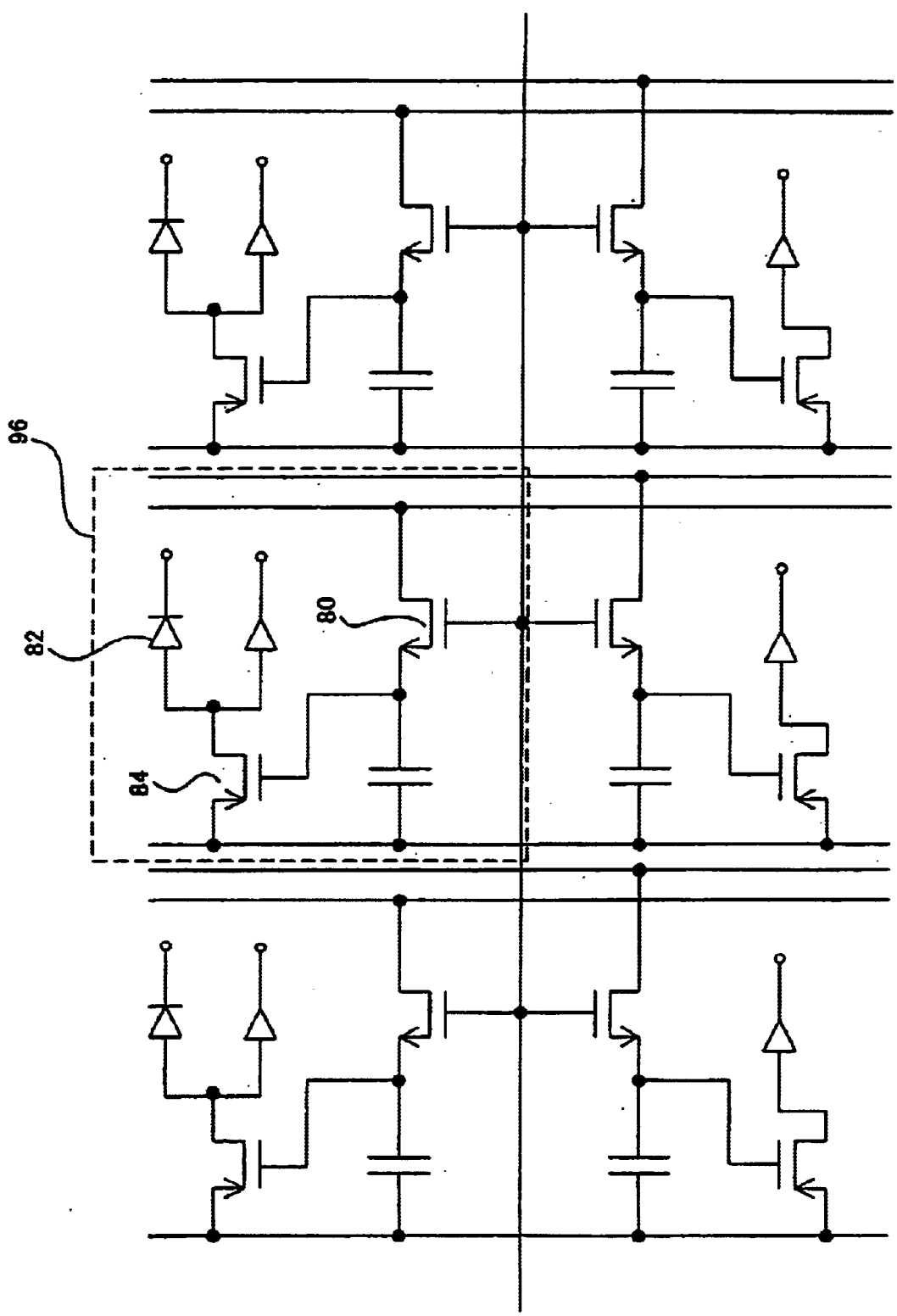
FIG. 11 is a diagram showing a driving circuit which has been heretofore proposed to implement an area gray level control method.
Figure 12:
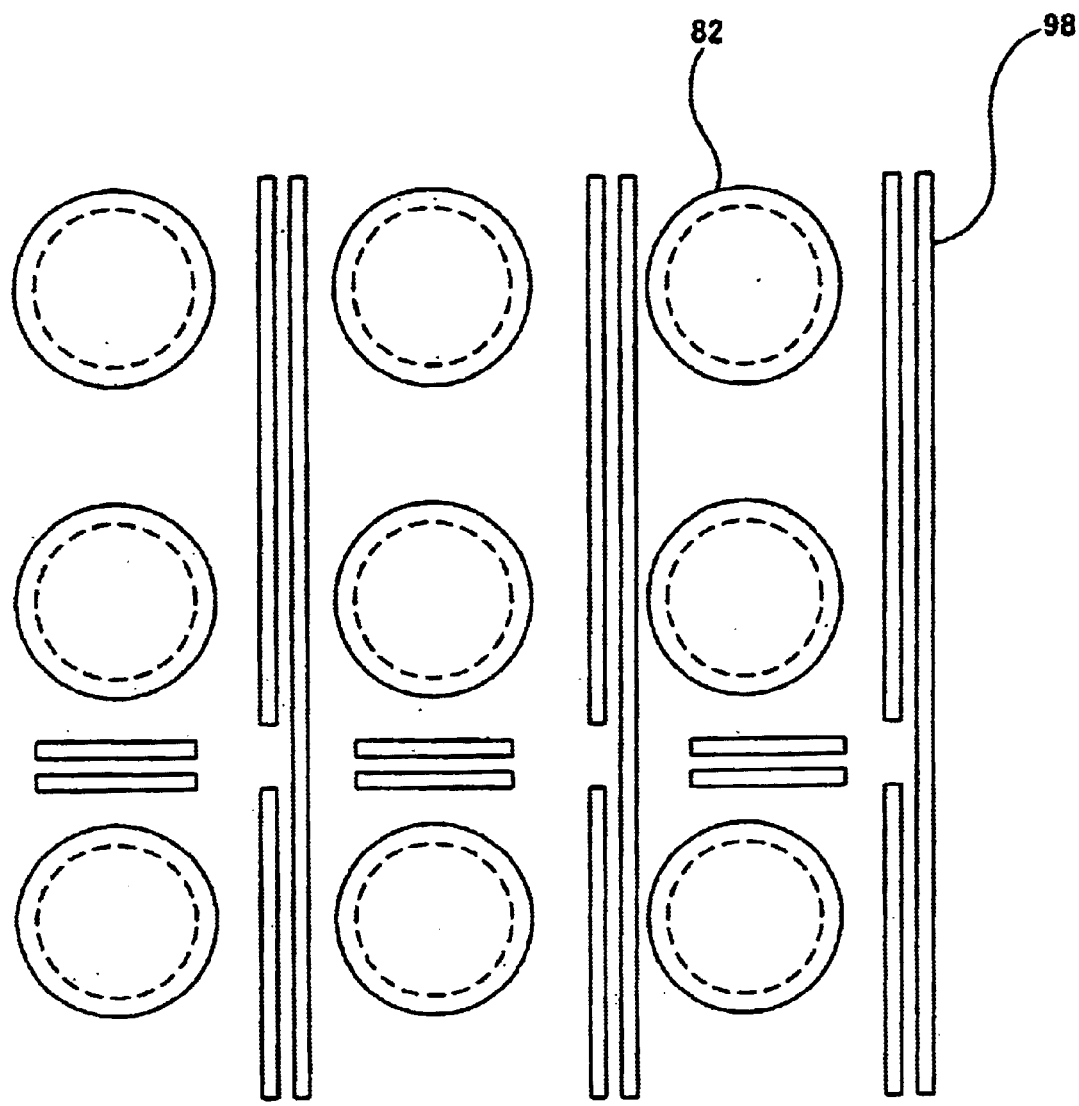
FIG. 12 is a plan view showing a configuration of a plurality of organic LED elements arranged for each pixel.

FIG. 8 shows an organic LED display device including the thin film transistor array substrate of the present invention. As shown in FIG. 8, the organic LED display device of the present invention includes an array of switching TFTs 57 and driver TFTs 58 which are formed for each of pixels formed on an insulating substrate 54, and a member 56 containing an active material capable of inducing electroluminescence is electrically connected to TFTs 57 and 58 through pixel electrodes 60. An opposite electrode 59 is located on active-material-containing member 56 on the side opposite substrate 54 so as to supply a current required for display to the active-material-containing member through each pixel electrode 60.

The thin film transistor array substrate of the present invention includes the above-mentioned controllers and thus enables precise gray level control of the current. Therefore, the TFT array substrate of the present invention enables gray level control of brightness levels without reducing an effective luminous area of the organic LED element between pixels. Moreover, the effective luminous area of the organic LED element does not decrease, thus eliminating the need to supply an excessive current to the organic LED element. Consequently, the life of each element can be extended.

Although the present invention has been described in detail above by referring to the embodiment shown in the drawings, the present invention is not limited to the embodiment shown in the drawings. Regarding the detailed configuration, the order in which the processes take place or the like, any configuration or any order may be appropriately applied to the present invention so long as the same or similar configuration can be obtained. Moreover, although the present invention has been described by referring to the specified embodiment which is configured to drive the organic LED element, the present invention may be applied to any display device that can be driven by the present invention, e.g., any display device suitable for the driving method using active matrix, such as a liquid crystal display device or an electroluminescence display device, as well as the organic LED element.

Although the preferred embodiment of the present invention has been described in detail, it should be understood that various changes, substitutions and alternations can be made therein without departing from spirit and scope of the inventions as defined by the appended claims.

What is claimed is:

1. A thin film transistor comprising:
    a first insulating film having a first and a second surface;
    an active layer positioned on a portion of said first surface of said first insulating film;
    a second insulating film positioned on said active layer and on said first surface of said first insulating film;
    a first gate electrode having a first area positioned on said second surface of said first insulating film;
    a second gate electrode positioned an said second insulating film, said second gate electrode having a second area less than or greater than said first area of said first gate electrode; and
    a first conductor connected to said first gate electrode for selectively applying a first voltage to said first gate electrode and operate said transistor in conjunction with or independent of said second gate electrode; and
    a second conductor connected to said second gate electrode for selectively applying a second voltage to said second gate electrode and operate said transistor in conjunction with or independent of said first gate electrode.

2. The thin film transistor according to claim 1, further including two conductive layers positioned on said active layer, each of said conductive layers including a side wall and a bottom wall connecting said sidewalls therein defining a channel, said bottom wall defined by said active layer.

3. The thin film transistor according to claim 2, wherein said bottom wall of said channel has a rectangular shape with a predetermined length and width.

4. The thin film transistor according to claim 3, wherein said first and second gate electrodes each have a rectangular shape with a predetermined length and width.

5. The thin film transistor according to claim 4, wherein said predetermined width of each of said fist and second gate electrodes is greater than said predetermined width of said bottom wall of said channel.

6. The thin film transistor according to claim 5, wherein said predetermined length of at least one of said first and second gate electrodes is greater than said predetermined length of said bottom wall of said channel.

7. The thin film transistor according to claim 1, wherein said first conductor comprises a first controller.

8. The thin film transistor according to claim 1, wherein said second conductor comprises a second controller.

9. The invention according to claim 1, wherein said thin film transistor is electrically connected to an organic LED element whereby the brightness of the LED is varied responsive to said gate or gates that are operating said transistors.

10. The invention according to claim 9, wherein said LED element comprises a plurality of pixels.

11. The invention according to claim 10, wherein said thin film transistor comprises a driver thin film transistor.

12. The invention according to claim 11, further including a switching thin film transistor.

13. The invention according to claim 12, wherein each one of said plurality of pixels includes at least one of said switching thin film transistors and at least one of said driver thin film transistors connected thereto.

14. A method of manufacturing a thin film transistor comprising the steps of:
   providing a first insulating film having a first and a second surface;
   positioning an active layer on a portion of said first surface of said first insulating film;
   positioning a second insulating film on said active layer and on said first surface of said first insulating film;
   positioning a first gate electrode having a first area on said second surface of said first insulating film;
   positioning a second gate electrode on said second insulating film, said second gate electrode having a second area less than or greater than said first area of said first gate electrode;
   connecting a first conductor to said first gate electrode for applying a first voltage to said first gate electrode; and
   connecting a second conductor to said second gate electrode for applying a second voltage to said second gate electrode.

15. The method of manufacturing a thin film transistor according to claim 14, wherein said step of positioning said active layer on said portion of said first surface of said fist insulating film is accomplished by chemical vapor deposition.

16. The method of manufacturing a thin film transistor according to claim 14, wherein said step of positioning said first gate electrode having a first area on said second surface of said first insulating film is accomplished by sputtering or vacuum deposition and photolithography.

* * * * *